United States Patent [19]

Wallis

[11] Patent Number: 5,233,538

[45] Date of Patent: Aug. 3, 1993

[54] WAVEFORM CAPTURING ARRANGEMENT IN A DISTRIBUTED POWER NETWORK

[75] Inventor: Lee D. Wallis, Murfreesboro, Tenn.

[73] Assignee: Square D Company, Palatine, Ill.

[21] Appl. No.: 622,432

[22] Filed: Dec. 5, 1990

Related U.S. Application Data

[63] Continuation-in-part of Ser. No. 503,267, Apr. 2, 1990, abandoned.

[51] Int. Cl.$^5$ .............................................. G01R 21/06
[52] U.S. Cl. .................................... 364/483; 364/492
[58] Field of Search .............................. 364/483, 492; 324/117 R, 126, 127, 142, 133; 340/870.38; 341/122, 123

[56] References Cited

U.S. PATENT DOCUMENTS

4,709,339 11/1987 Fernandes ........................... 364/483
4,777,607 10/1988 Maury et al. ........................ 364/492

Primary Examiner—Edward R. Cosimano
Assistant Examiner—Ellis B. Ramirez
Attorney, Agent, or Firm—Larry I. Golden; Kareem M. Irfan

[57] ABSTRACT

A circuit monitoring system for a distributed power network employs waveform capturing techniques for efficient and highly accurate monitoring. The system includes a plurality of circuit monitors and a control station, which is coupled to each of the circuit monitors via a multi-drop communications link. Each of the circuit monitors is disposed adjacent an associated one of the branches in the network for sensing power parameters in the branches and for generating and transmitting data representing the power parameters to the control station. The control station is used for generating monitoring commands to each of the circuit monitors to provide the system with full system control and evaluation capability. The system is capable of simultaneously sensing the waveform at each branch and sampling the waveforms for a predetermined number of sample points over an integral number of cycles so as to provide an efficient yet accurate implementation.

24 Claims, 10 Drawing Sheets

WAVEFORM CAPTURING ARRANGEMENT IN A DISTRIBUTED POWER NETWORK

CROSS REFERENCE TO RELATED APPLICATION

This is a continuation of U.S. patent application Ser. No. 07/503,267, filed on Apr. 2, 1990 now abandoned, entitled WAVEFORM CAPTURING ARRANGEMENT IN A DISTRIBUTED POWER NETWORK

FIELD OF THE INVENTION

The present invention relates generally to the practice of sensing electrical power, and more particularly, to techniques and arrangements for measuring, communicating and analyzing parameters associated with electrical distributed power networks.

BACKGROUND OF THE INVENTION

Industrial power users are rapidly becoming aware of the importance of monitoring distributed power networks. Proper monitoring can provide tangible benefits with respect to equipment operation and maintenance; therefore, significant return on investment. More specifically, these benefits include savings in terms of equipment energy cost and maintenance costs, better equipment utilization, and increased system reliability.

Electric utility applications have ranged from supervisory control and data acquisition (SCADA) systems, primarily concerned with remote operations, to distribution automation, which focuses on operating efficiency. Certain utility applications have included devices mounted on power lines for sensing operating parameters of an associated power conductor. For example, in U.S. Pat. Nos. 4,158,810, 4,261,818, and 4,709,339, line mounted sensor modules have been described which measure the magnitudes of signal parameters associated with power lines. These parameters include current, voltage, conductor temperature and ambient temperature. Once captured by the sensor module, data corresponding to these parameters is remotely processed and evaluated.

Prior art systems of this type, although representing a significant improvement over traditional power line monitoring techniques, have a number of disadvantages. Among these disadvantages are the inabilities to efficiently and accurately measure the parameters associated with the power lines and to perform such measurements in a cost-effective manner. Moreover, the structures and techniques that have been used to implement these systems have been intolerably complex for many applications.

For many industrial applications, retro-fitting existing power systems with previously installed equipment is becoming a necessary step to provide a distributed power network monitoring system that is practicable. Unfortunately, the vast majority of such installed equipment was furnished with little or no remote communications capability. In those few systems having remote communications capability, the power sensing techniques provided thereby are incompatible with most of the recently developed systems and techniques.

Accordingly, there is a need for a monitoring system for a distributed power network that can be implemented without the aforementioned shortcomings.

SUMMARY OF THE INVENTION

It is a general object of the present invention to provide a system and method for monitoring power parameters at various points of a power line distributed network and to provide data corresponding to such measurements to a central point for analysis and evaluation.

It is a more specific object of the present invention to provide such a monitoring system that can be easily retro-fit with existing circuit breaker arrangements.

In accordance with a preferred embodiment, the present invention provides a circuit monitoring system for a distributed power network, in which power-related waveforms ares passed through a multitude of network branches and associated loads and wherein zero-crossings of the waveform define their respective periods. The system includes a plurality of monitoring means, each of which is disposed adjacent an associated one of the branches, for sensing power parameters associated with the power-related waveform and for generating and transmitting data representative thereof. Each of the monitoring means includes detection means for sensing the zero-crossings of the waveform and sampling means for sampling the power-related waveform for a predetermined number of sample points over an integral number of cycles. Further, a control station is coupled to each of the monitoring means for generating monitoring commands to the plurality of monitoring means and for receiving and evaluating the data transmitted therefrom.

In one embodiment of the present invention, the sampling that is performed at each of the branches pertains to a substantially simultaneous point in time. Using the control station, for example, all the monitoring means may be programmed by the control station 108, or some local means, to sample the power in the associated network branches simultaneously. This is an important advantage, because it can be used to provide an overall evaluation of the system without having to compensate for errors that result from time-dependent system variations.

BRIEF DESCRIPTION OF THE DRAWINGS

Other objects and advantages of the invention will become apparent upon reading the following detailed description and upon reference to the drawings in which.

While the invention is susceptible to various modifications and alternative forms, a specific embodiment thereof has been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENTS

Figure 1:
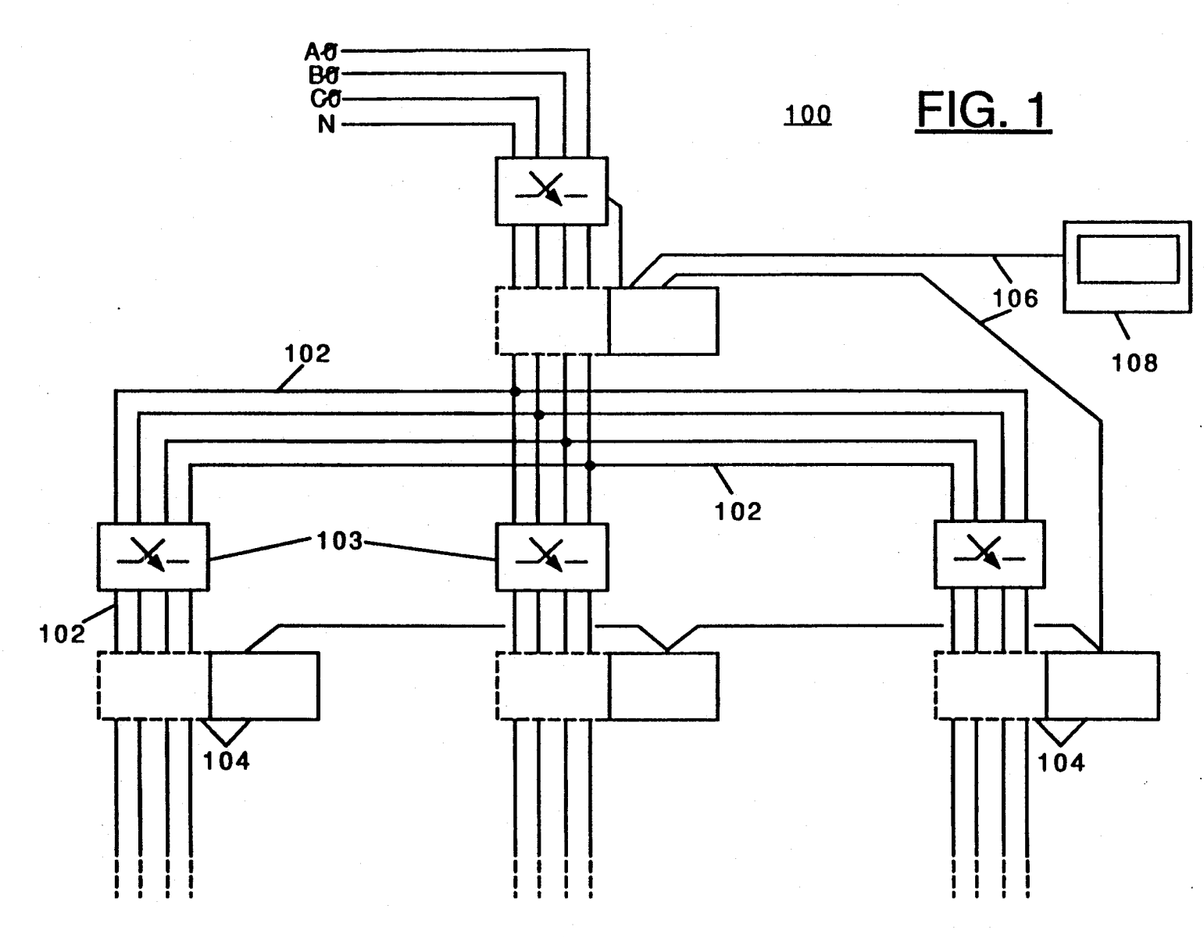
FIG. 1 is a diagram of a three-phase distributed power network having a monitoring system coupled thereto, in accordance with the present invention, for monitoring and evaluating power parameters in the network.

The present invention is particularly advantageous in industrial applications wherein a distributed power network supplies power to a multitude of loads, e.g., various types of power equipment. FIG. 1 illustrates such an application in which a three-phase (A, B, C), four-wire (A-C, N) distribution system 100 feeds a number of network branches 102 and associated loads (not shown). While this system could be modified to accommodate a three-phase/three-wire, or other, implementation, the system shown in FIG. 1 is representative and the present invention is discussed the context of this illustrated implementation.

In the system of FIG. 1, the network branches 102 include conventional interruption devices 103 for "breaking" the circuit path defined thereby. Adjacent the interruption devices 103, the system includes associated metering units 104, each of which is communicatively coupled via a communication link 106 to a control station 108. The communication link 106 may be implemented using the protocol set forth in SY/-MAX® Instruction Bulletin, Dec. 8, 1988, available from Square D Company, Palatine, Illinois. Together, the metering units 104, the communication link 106 and the control station 108 are used to implement a retro-fittable monitoring system for the distribution system 100. The control station 108 is preferably implemented using a desk-top controller, e.g., an IBM PC/AT ® and compatibles, having a keyboard, a display and a processor for sending commands and for analyzing information sent from the metering units 104.

The monitoring system of FIG. 1 provides a user, located at the control station 108, the ability to monitor the electrical activity in each branch, or at each load, remotely. Equally important, the communication link 106 and the control station 108 provide a conveniently located control point at which electrical activity at various points in the system can be monitored at certain predetermined times, under preselected conditions, and analyzed and evaluated for ongoing system and equipment maintenance and control. Using the control station 108, for example, all the metering units 104 may be instructed to sample the power in the associated network branches 102 at any given time. This sampling time can be preprogrammed by the control station 108, thereby collecting power-related information from all the network branches simultaneously. This is an important advantage, because it can be used to provide an overall evaluation of the system without having to compensate for errors that result from time-dependent system variations.

Figure 2:
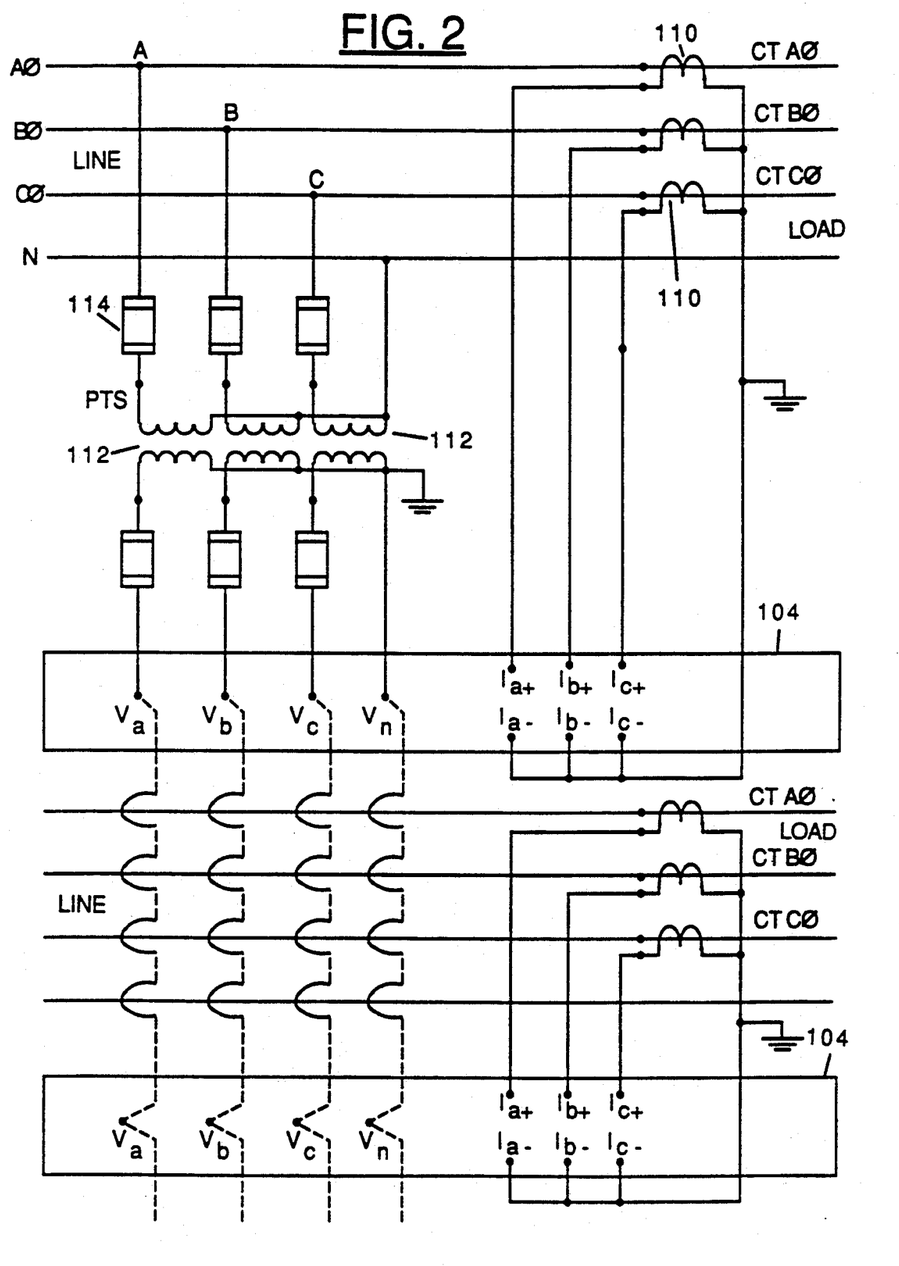
FIG. 2 a diagram illustrating, in more detail, the manner in which the system of FIG. 1 is coupled to the three-phase distributed power network.

FIG. 2 illustrates a manner in which the metering units 104 of FIG. 1 may be coupled to the lines in each of the network branches 102. As shown in FIG. 2, one current transformer (CT) 110 is used for each phase in each metering unit 104 with one side of each CT 110 electrically connected to ground for the associated metering unit 104. However, three potential transformers (PT) 112 may be shared by more than one metering unit 104 by arranging the PTs 112 to sense the voltages in parallel, unlike the arrangements of the CTs 110. Fuses 114 may be used to protect all the metering units 104 at their PT input terminals. Thus, a total of eight lines (ten terminals) are used at each metering unit 104 for coupling the power-related information from the CTs 110 and PTs 112 to the metering units 104.

Figure 3:
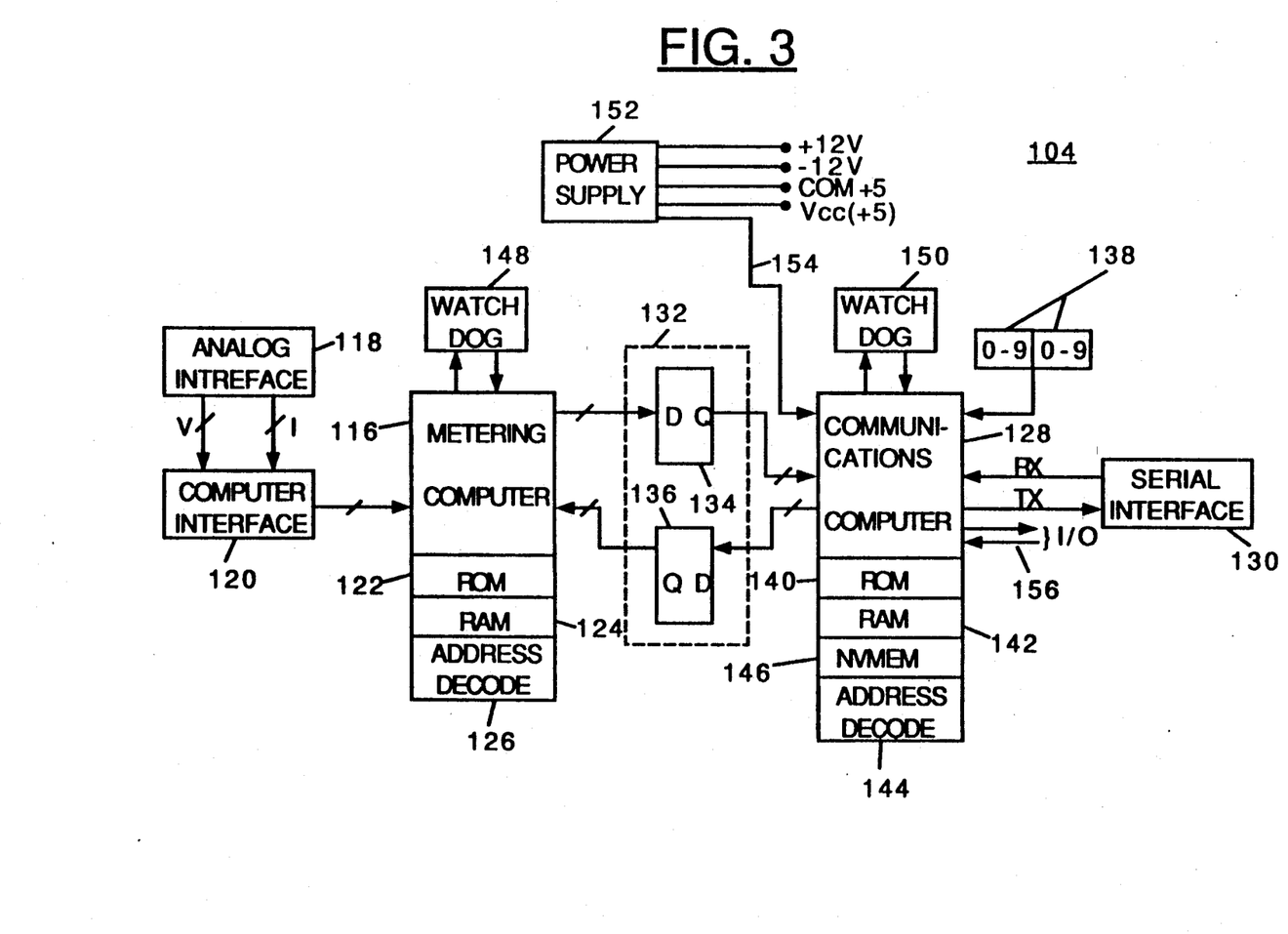
FIG. 3 is a block diagram of a metering unit or circuit monitor, in accordance with the present invention, which may be used for monitoring power parameters in the network of FIG. 1 and for transmitting that information to a central point for evaluation.

A preferred manner of processing the power-related information within each metering unit 104 is illustrated in FIG. 3. Generally, the power-related information is introduced to a metering computer 116 via analog and computer interface circuits 118 and 120. Using conventional read-only memory (ROM) 122, read-write memory (RAM) 124 and address decoding circuitry 126, the metering computer 116 collects digital samples of the power-related information from the CTs 110 and the PTs 112 (FIG. 2) to acquire an extremely accurate representation of the current and voltage waveforms carried in the associated network branch 102.

This data that is collected by the metering computer 116 is processed and passed to a communications computer 128 for further processing and for transmission to the control station 108, via a serial interface circuit 130. Processing by the metering computer 116 includes computations that can be performed independent of time, whereas processing by the communications computer 128 performs time dependent computation such as demand readings and energy calculations which require integration over time.

A data passing circuit 132 ("mailbox"), which includes a pair of 8-bit latches 134 and 136 (e.g., 74HCT373-type integrated circuits), is used to provide two-way data communication between the metering computer 116 and the communications computer 128 in the form of multi-byte packets. Each packet preferably includes a preamble which indicates the type of information being sent. For example, each of the information types passed from the metering computer 116 to the communications computer 128 may include a unique preamble to indicate the information type. For additional information concerning this and other programming of the metering unit 104, reference may be made to PowerLogic ® (TM) Circuit Monitor Class 3020, Instruction Bulletin: 63074-140-01, 1989, available from Square D Company, Palatine, Illinois.

Communication between the communications computer 128 and the control station 108 is facilitated by manually setting BCD-formatted rotary switches 138 to a designated address. This allows the control station 108 to differentiate between the multitude of metering units 104 communicating over the communication link 106 (FIG. 1).

Like the metering computer 116, the communications computer 128 employs conventional ROM 140, RAM 142 and address decoding circuitry 144. Data is passed between the computers 116 and 128 through the mailbox using read (output enable) and write (latch) control lines which are developed from the respective address decoding circuits 126 and 144 associated with the computers 116 and 128. Additionally, to prevent loss of data in the event of a power failure, non-volatile memory 146 is included to allow the communications computer 128 to store set-up and operational data which may be sent from the control station 108 or other data from the metering computer 116. The non-volatile memory 146 may be implemented using an X2001/X2004-type integrated circuit ("IC") available from Xilog, Inc. Both the metering computer 116 and the communications computer 128 may be implemented using 8031-type microcontrollers, available from Intel, Inc.

The metering unit 104 also includes a watchdog timer circuit 150 and a power supply 152. The watchdog timer circuit 150 is used by the communications computer 128 in a conventional manner to monitor its integrity, and may be implemented using a DS1232-type IC, available from Dallas Semiconductor, Inc., Dallas, Tx. The power supply 152 is conventional. It may be fed from an AC line to provide ±12 v (Volts) and ±5 v ("Vcc") for the entire metering unit 104 and a communication supply ("COM +5v") for the serial interface circuit 130. The power supply 152 is monitored by the communications computer 128, using a power fail line 154 to interrupt its operation, to allow the communications computer 128 to store any necessary data in non-volatile memory 146 before operating power is lost.

The communications computer 128 is also equipped with input/output (I/O) lines 156 for providing optional functions. These I/O lines 156 may be used, for example, to trigger the interruption devices 103 (FIG. 1) when one or more predetermined conditions have been detected within the metering unit 104 or at the control station 108.

An important application of the present invention concerns retro-fitting the metering unit 104, or the entire the monitoring system of FIG. 1, with a previously installed interruption device 103 having a peak sensing tripping mechanism. Interruption devices of this type trip upon the detection of the peak of the waveform exceeding a predetermined threshold. Presuming the presence of a non-sinusoidal waveform, the metering units 104 of the present invention detect the peak value, calculate the RMS (root mean squared) value for a sinusoidal waveform having the same peak value and report that calculated value to the control station 108. This allows a user at the control station to evaluate the suitability of the interruption device for the load connected thereto.

Figure 4A:
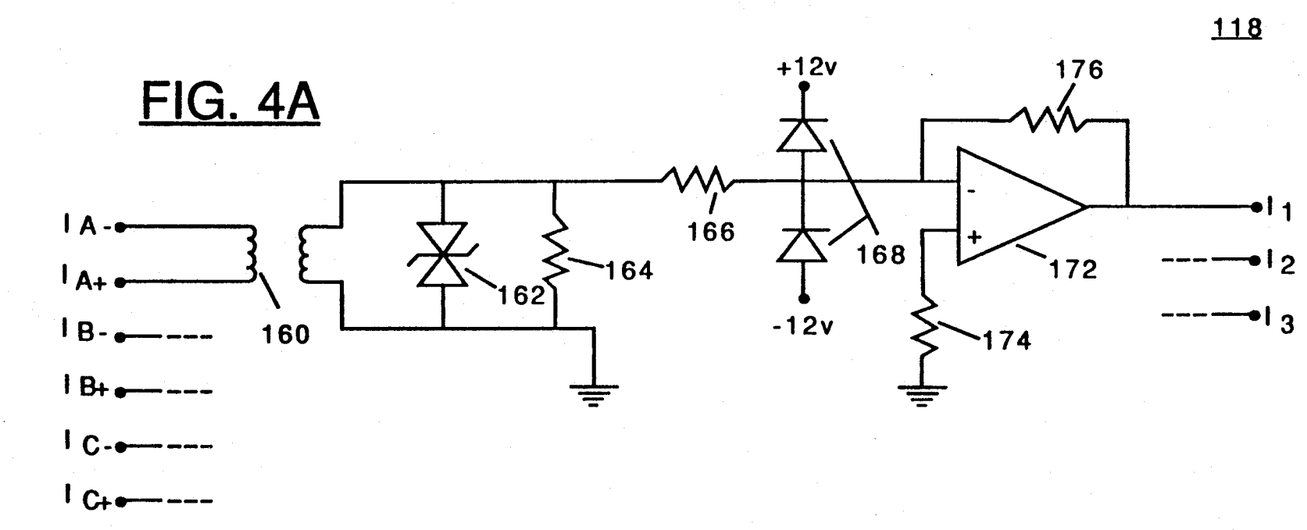
FIGS. 4a and 4b comprise a circuit diagram of an analog interface arrangement, which is part of the circuit monitor of FIG. 3, for coupling the power parameters in the three-phase lines to the monitor.
Figure 4B:
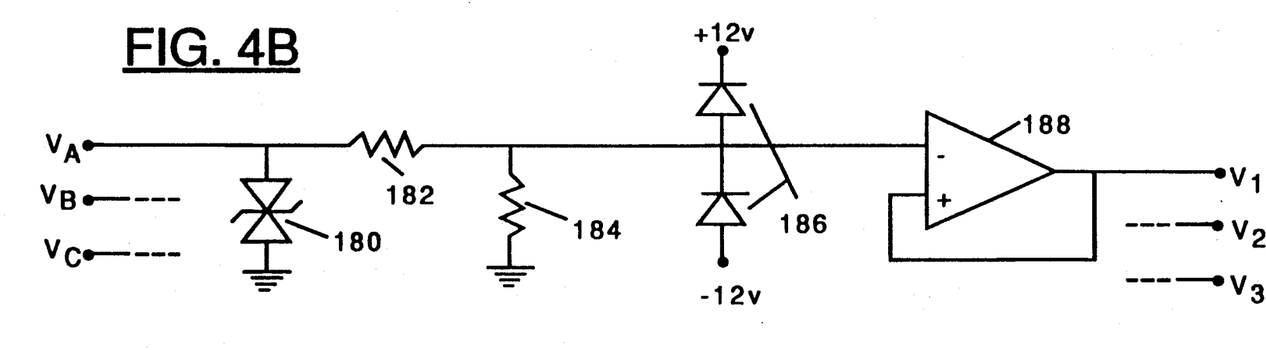

As illustrated in FIGS. 4a and 4b, the analog interface circuit 118 of FIG. 3 includes two types of circuits for presenting the power-related information from the eight input lines (FIG. 2) of the metering unit 104 to the remaining circuitry. In FIG. 4a, a circuit is shown for coupling the current sensed by each associated CT 110 (FIG. 2) to the computer interface circuit 120 of FIG. 3. The respective inputs to each of these three identical circuits of FIG. 4a are IA− and IA+, IB− and IB+, and IB− and IB+, and its respective outputs are I1, I2 and I3.

The circuit of FIG. 4a includes a current transformer 160 for stepping-down the sensed current from a nominal 5 Amps to about 3 milli-Amps, a transorb 162 for protection from high level current transients, a 165 Ohm resistor 164 for developing a voltage from the sensed current, diodes 168 for protection from voltage transients greater than +12 v or less than −12 v, and an operational amplifier 172. The operational amplifier 172, using a 10 ohm resistor 166, a 8.25 ohm resistor 174 and a 51.1 ohm resistor 176, provides the appropriate signal amplification for the computer interface circuit 120.

The circuit of FIG. 4b is used to couple the voltage sensed by each PT 112 (FIG. 2) to the computer interface circuit 120 of FIG. 3. The respective inputs to each of these three identical circuits of FIG. 4b are VA, VB and VC, and its respective outputs are V1, V2 and V3. The circuit of FIG. 4b includes a transorb 180 for protection from high level voltage transients, a voltage divider comprising a 1 mega-Ohm resistor 182 and a 20 kOhm resistor 184, diodes 186 for protection from voltage transients greater than +12 v or less than −12 v, and an operational amplifier 188 which acts as a unity gain buffer for the computer interface circuit 120.

Each of the components illustrated in FIGS. 4a and 4b is conventional and readily available from a number of commercial suppliers.

Figure 5:
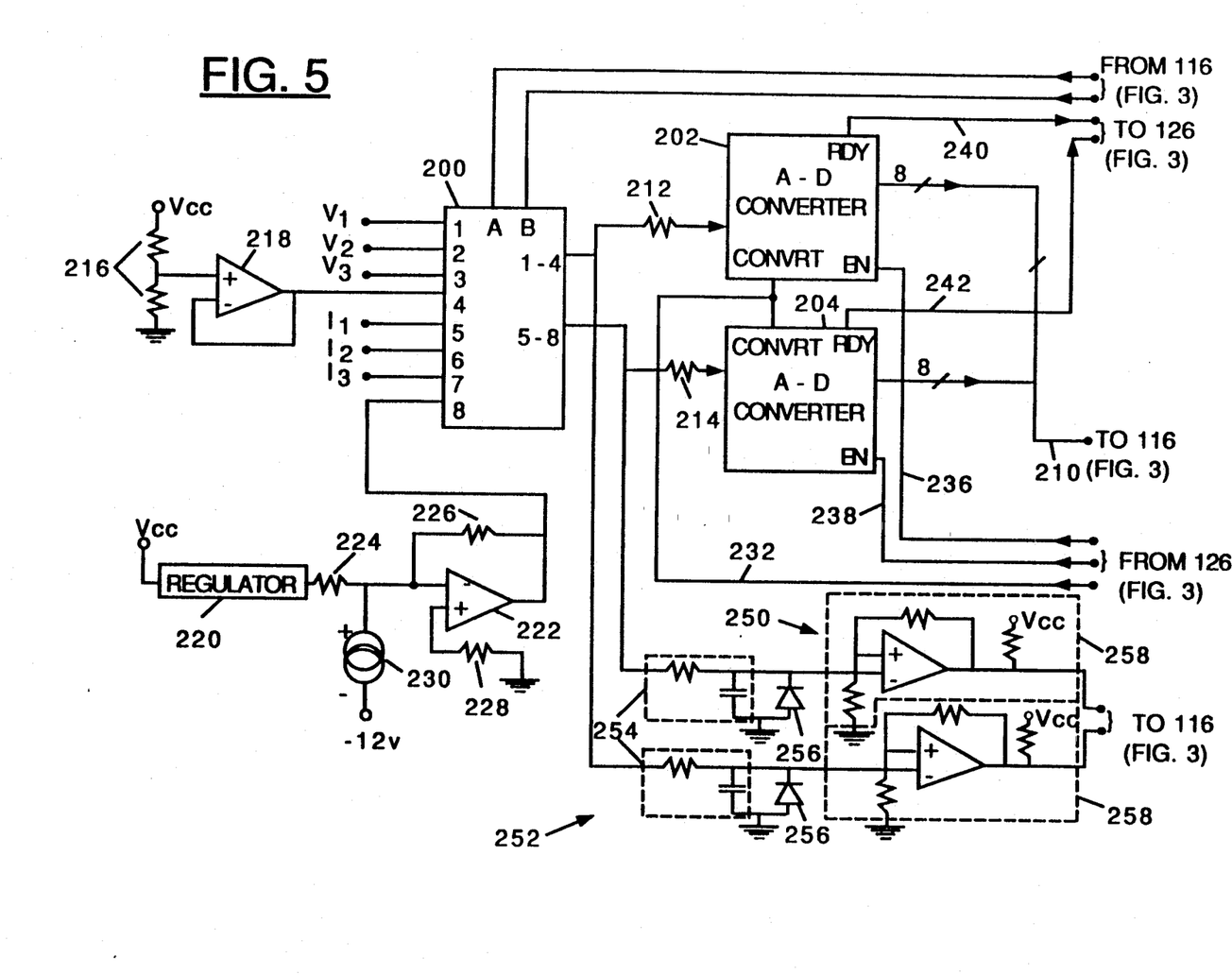
FIG. 5 is a circuit diagram of a computer interface arrangement, which is another part of the circuit monitor of FIG. 3, for coupling data provided from the analog interface arrangement to the remainder of the circuit monitor.

Another important aspect of the present invention is the computer interface circuit 120, depicted in FIG. 5. This circuit 120 includes a special arrangement of circuitry which generates, accurately and efficiently, digital data representing the power-related information at the V1-V3 and I1-I3 outputs of the analog interface circuit 118. The circuit 120 is centered around a demultiplexer 200 and a pair of analog to digital (A-D) converters 202 and 204. The demultiplexer 200 may be implemented using an AD7502-type IC, and each A-D converter 202 or 204 may be implemented using an AD673-type IC; both of which are available from Analog Devices, Inc.

The demultiplexer 200 is controlled by the metering computer 116 to feed the A-D converters 202 and 204 with the V1-V3 and I1-I3 outputs of the analog interface circuit 118 in a pseudo-simultaneous manner. The A-D converters 202 and 204 receive and convert the V1-V3 and the I1-I3 signals, via 15 Ohm current limiting resistors 212 and 214, respectively, to 8-bit data samples which are placed on the data bus 210 of the metering computer 116 for processing thereby.

In addition to the V1-V3 and I1-I3 signals, the demultiplexer 200 couples a voltage test signal and a temperature-related input to the A-D converters 202 and 204. The voltage reference signal is provided by a buffered voltage divider circuit comprising a pair of 20 Ohm resistors 216 and an operational amplifier 218. This signal is converted through the A-D converter 202 and may be used by the metering computer 116 to monitor the integrity of its power, as an alternative to the function provided by line 154 of FIG. 3. If the voltage reference signal falls below about 4.75 v, the metering computer 116 can inform the communications computer 128, which can then store critical data in the nonvolatile memory 146.

The temperature-related input to the demultiplexer 200 is used to indicate the ambient temperature of the metering unit 104. This ambient temperature is indicative of the temperature outside the metering unit as well as the temperature of any loads (e.g., power equipment) situated nearby. Thus, this temperature indicating function may be advantageously used at the control station 108 to monitor the environment of each of the various network branches 102 and the metering units 104 in the system.

The circuit supporting this function employs a voltage regulator 220 and an amplifier circuit comprising an operational amplifier 222 and incorporating a temperature transducer 230. The voltage regulator 220 is used to deliver a stable 2.5 v signal to a 1%, 9.09 ohm resistor 224. The temperature transducer 230 is shown as a temperature sensitive current source having a constant current source whose output is controlled by temperature, for example, in microamps per degree Kelvin. A 1%, 51.1 ohm resistor 226 and a 7.5 ohm resistor 228 are used with the operational amplifier 22 to amplify the signal to the appropriate level for the demultiplexer 200.

The metering computer 116 is preferably programmed to use two of its peripheral output ports to control the A/B selection terminals of the demultiplexer 200. More specifically, the metering computer 116 forces the A/B terminals of the demultiplexer 200 through four binary states to produce, at its two outputs ("1-4" and 5-8"), the inputs (including V1-V3 and I1-I3) in a sequential manner. For example, when the A/B terminals are in the 00 binary state, the two outputs produce V1 and I1, respectively; when the A/B terminals are in the 01 binary state, the two outputs produce V2 and I2, respectively, etc.

The metering computer 116 may be programmed to retrieve the 8-bit data samples from the A-D converters 202 and 204 by controlling their convert (CONVRT) ports, via line 232, and enable (EN) ports, via lines 236 and 238, and by monitoring their ready (RDY) ports, via lines 240 and 242, in a timely manner. This timing is preferably implemented with control of the A/B terminals of the demultiplexer 200 as in the following example. The A/B terminals are set to 00 to receive the V1 and I1 inputs. Next, the line 232 is set to convert the V1 and I1 signals to 8-bit data samples. The metering computer 116 then monitors the lines 240 and 242 until a data ready indication is present. In response to such an indication, the metering computer 116 activates the associated enable (EN) ports using lines 236 and 238 and reads each sample over the data bus 210. Although retrieval of the other demultiplexer inputs is handled in the same manner, the voltage test signal and the temperature-related input to the A-D converters 202 and 204 are preferably retrieved less frequently than the V1 and I1 signals. For example, the voltage test signal and the temperature-related input may be retrieved once for every 256 samples of the V1 and I1 signals.

The two outputs ("1-4" and 5-8") of the demultiplexer 200 are also provided to conventional and identical "clock" generating circuits 250 and 252, which generate digital clock signals for the metering computer 116. Each clock generating circuit 250 or 252 includes a low pass filter 254, implemented using a resistor-capacitor arrangement, a diode 256 acting as a voltage clamp, and a conventional amplifier 258 with histerisis to provide a noise-resistant digital waveform representative of the sensed voltage and current waveforms. These digital clock signals correspond to the cycles of the sensed voltages and currents, and may be used by the metering computer 116 to determine the zero crossings in the V1 and I1 signal waveforms.

Alternatively, the zero-crossings may be detected by the metering computer 116. As the digital samples are received by the metering computer 116, the values of the digital samples may be monitored to detect the exact points at which the crossings occur. The metering computer 116 is able to follow the slope of the signal independently of any noise. For this reason, this method is preferred over the former method because it is more noise-resistant than the former method.

More specifically, the sampling frequency is established and the 8-bit data samples are obtained by programming the metering computer 116 with a sequence of instructions which are regularly executed to provide an accurate representation of the sampled waveform. It has been determined that in order to accomplish this, about 256 samples over a number of integral cycles, e.g., 2-4 cycles, is needed. This enables full utilization of the samples obtained during that record length, and minimizes the undesired truncation error associated with subsequent computations. Although the exact number 256 is not critical, subsequent computation using these samples, e.g., computing the Fast Fourier Transform (FFT) for calculating harmonics, is facilitated by using a sampling number which is an order of two; thus, the sampling number 256 is preferred. Moreover, 128 samples is not adequate for the purposes of accuracy.

This sampling technique allows for a variance in frequency from about 23 Hz. to 65 Hz., while maintaining the required sampling interval high enough to satisfy the Nyquist criteria and low enough to be practicable. Accordingly, the integral number of contiguous cycles is selected based on the detected frequency. Assuming that the minimum time to sample all three phases (minimum sampling window) is 230 microseconds and 256 samples are obtained over the number of integral cycles, this number should be selected such that the minimum sampling window is less than the actual time required to sample each point. For example, if the detected waveform frequency is 65 Hz., the number of integral cycles may be 3 but not greater than 4. If the detected waveform frequency is 50 Hz., the number of integral cycles may be 2 but not greater than 3.

Figure 6:
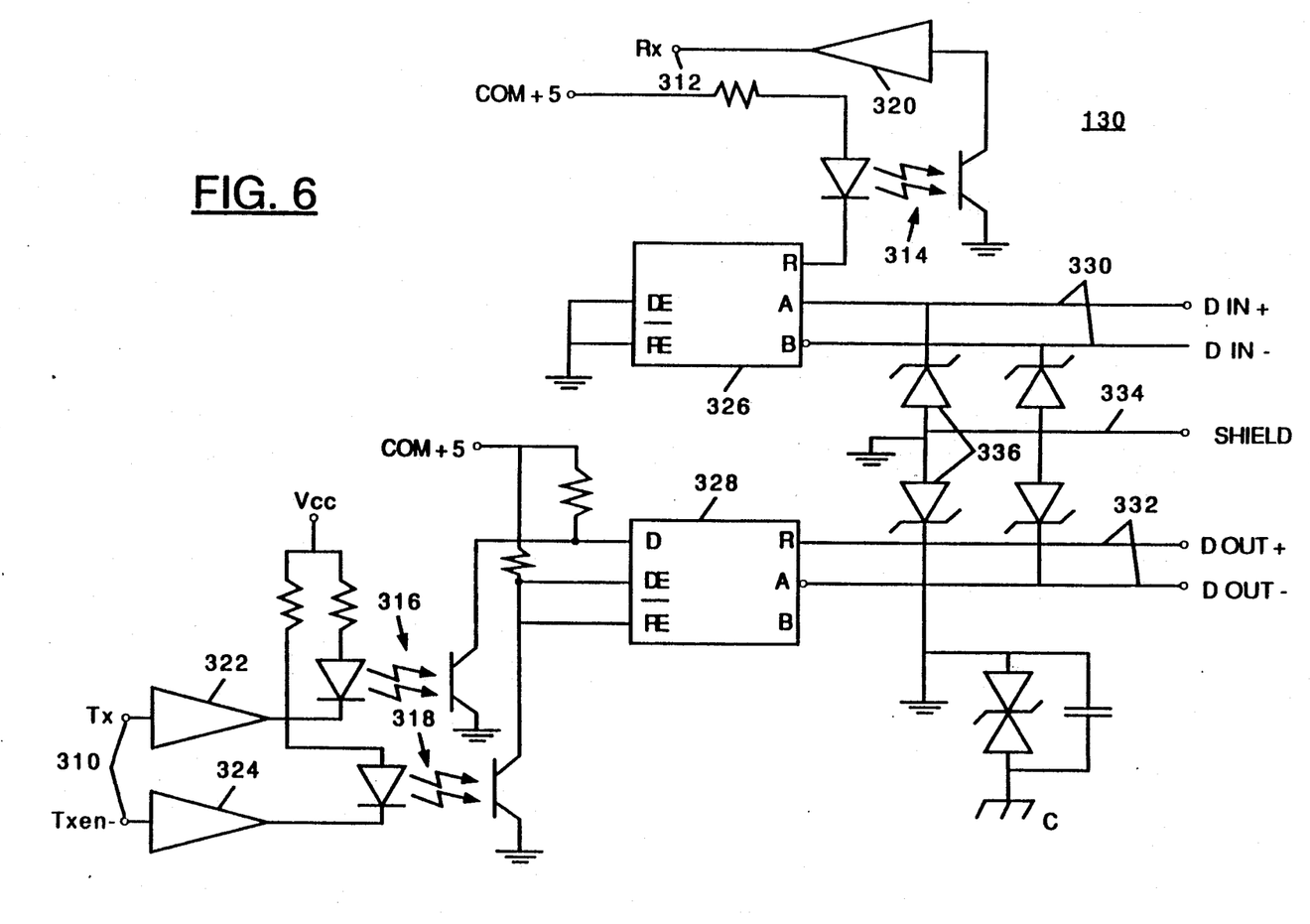
FIG. 6 is a circuit diagram of a serial interface arrangement (another part of the circuit monitor of FIG. 3) for coupling data between a control station and the circuit monitor of FIG. 3.

Referring now to FIG. 6, the serial interface circuit 130 is shown to include transmit and transmit control ports 310 and a receive port 312 for communicating with the communications computer 128. Signals coupled to the ports use conventional optical isolation circuits 314-318 and associated buffers 320-324.

Data passing through the serial interface circuit 130 is processed by a pair of two-wire interface circuits 326 and 328, such as SN65176B-type ICs, available from Texas Instruments, Inc. The circuits 326 and 328, which are preferably IEEE RS-422/RS485 compatible, allow for a number of monitoring units 104 to be multi-dropped for communication with the control station 108. Such an interface typically employs a pair of input lines 330 (DIN+ and DOUT−), a pair of output lines 332 (DOUT+ and DOUT−) and a shield 334. Zener diodes 336 may be used to protect the lines 330-332 from transients.

Figure 7:
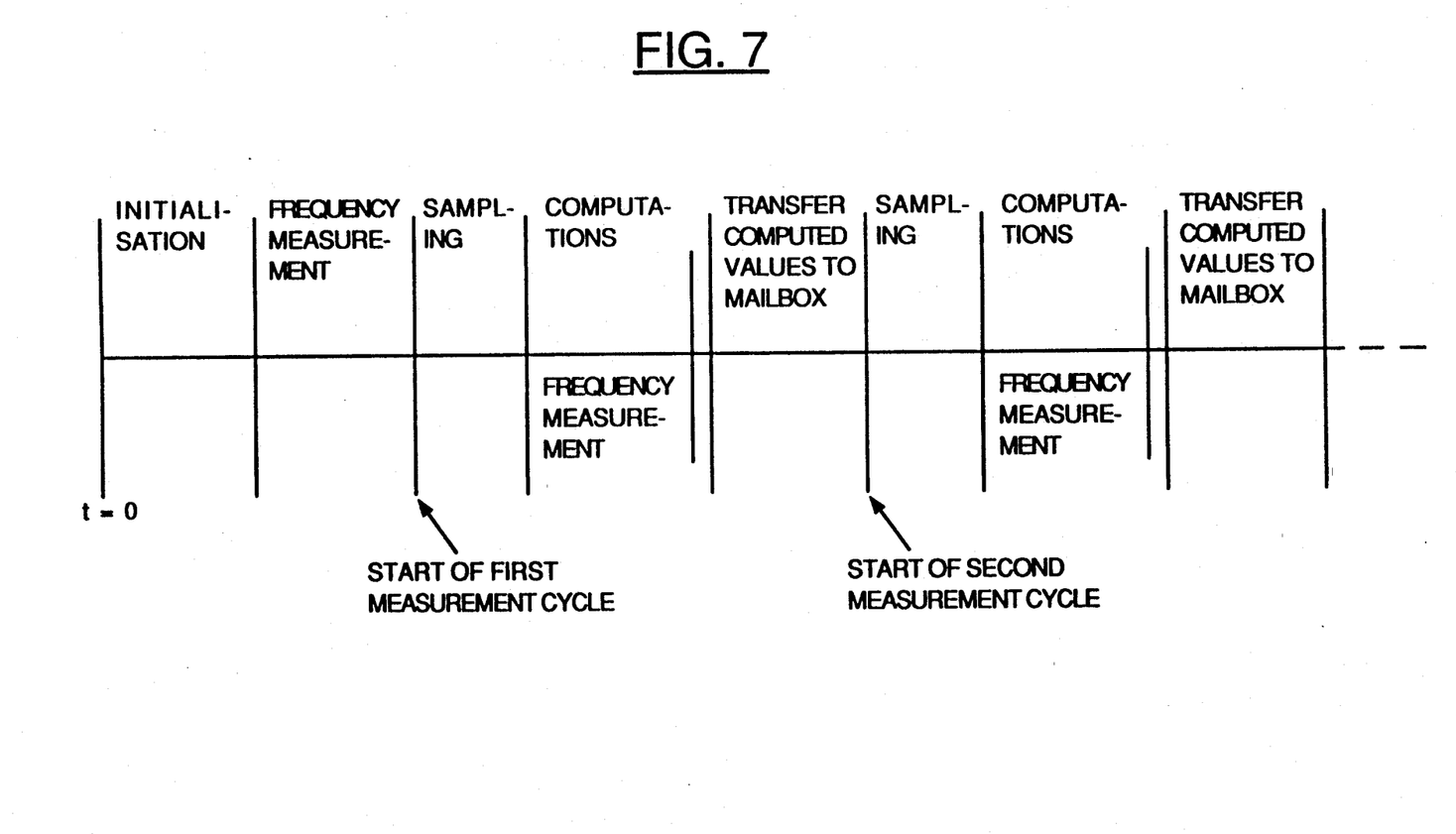
FIG. 7 is a timing diagram, according to the present invention, which illustrates a manner in which voltage and current samples be processed.

FIG. 7 illustrates a timing diagram which exemplifies the collection and processing of the V1-V3 and I1-I3 signals for one complete sample. The procedure begins with an initialization which includes a power check (via the Vcc test input to the demultiplexer), a self test to ensure that the memory and peripheral circuits are responding properly, and communication with the communications computer to receive set-up parameters (such as the CT and PT primary ratings and voltage gains and offsets) from the control station. The metering computer then determines the frequencies of each of the V1-V3 signals. This is accomplished, using an assumed (default) frequency of 55 Hz, by sampling each of the voltage inputs to the demultiplexer until at least two zero-crossings are detected, and then calculating the time between zero-crossings. This cycle time is divided by 256 to establish the time interval between samples of each of the V1-V3 signals ("sampling time interval").

Once the frequency has been measured, a repetitive sampling/computation/data-transfer process is executed for each cycle, as indicated in FIG. 7. The metering computer samples each of the V1-V3 and I1-I3 signals in the manner previously discussed. That is, at the end of each sampling time interval: the V1 and I1 signals are sampled, converted and read; then the V2 and I2 signals are sampled, converted and read; and finally the V3 and I3 signals are sampled, converted and read. These samples are performed to retrieve and compute power-related measurements therefrom, and also to detect any changes in the time between zero-crossings that may be occurring in the V3 signals. If any such change is detected, the sampling time interval is re-calculated for the next cycle, with 256 samples taken between the zero-crossings defining that cycle.

Also occurring before the next cycle, the metering computer transfers the computed power-related measurements to the mailbox for retrieval by the communications computer. These computations and measurements, which are discussed in more detail in connection with FIG. 9, preferably include: the temperature, the calculated RMS current of each of phases A, B and C, the average of the RMS currents, the maximum instantaneous peak of these RMS currents, the RMS voltages of each of V1-V3 signals (with respect to the neutral line), the true power factor for the 3-phases as a whole and for each of the phases separately, the 3-phase apparent power, the 3-phase reactive power, and the 3-phase real power. The equations for implementing each of these calculations are listed in Appendix A.

Additional measurements and computations performed by the metering computer concern the phase frequencies and the RMS voltages between the phases. With regard to the phase frequencies, the metering computer sends three frequency measurements through the mailbox. Two of these measurements always represent the frequencies of phases A and B (FIG. 1). The third measurement that is sent is dependent upon the measured frequencies of one or more of the phases A, B and C. If the frequency of phase A is greater than 24 Hz, then the measured frequency of phase A is sent. If the frequency of phase A is less than or equal to 24 Hz and the frequency of phase B is greater than 24 Hz, then the measured frequency of phase B is sent. If the above two conditions are not met, then the measured frequency of phase C is sent if it is greater than 24 Hz. Additionally, the corresponding phase voltages should be significant before reporting the frequency. Otherwise, zero is sent. This informs the communications computer that no suitable PT input voltage is present at the PT input terminals of the metering unit.

With regard to the RMS voltages between the phases, because the V1-V3 signals are passed through the demultiplexer (FIG. 5) in a pseudo-simultaneous manner, i.e., sequentially after each sampling time interval, the voltage differences between the phases cannot be measured at precisely the same time. This problem is overcome by linearly interpolating these RMS voltages, using the actual values obtained by sampling at the end of each sampling time interval.

Figure 8:
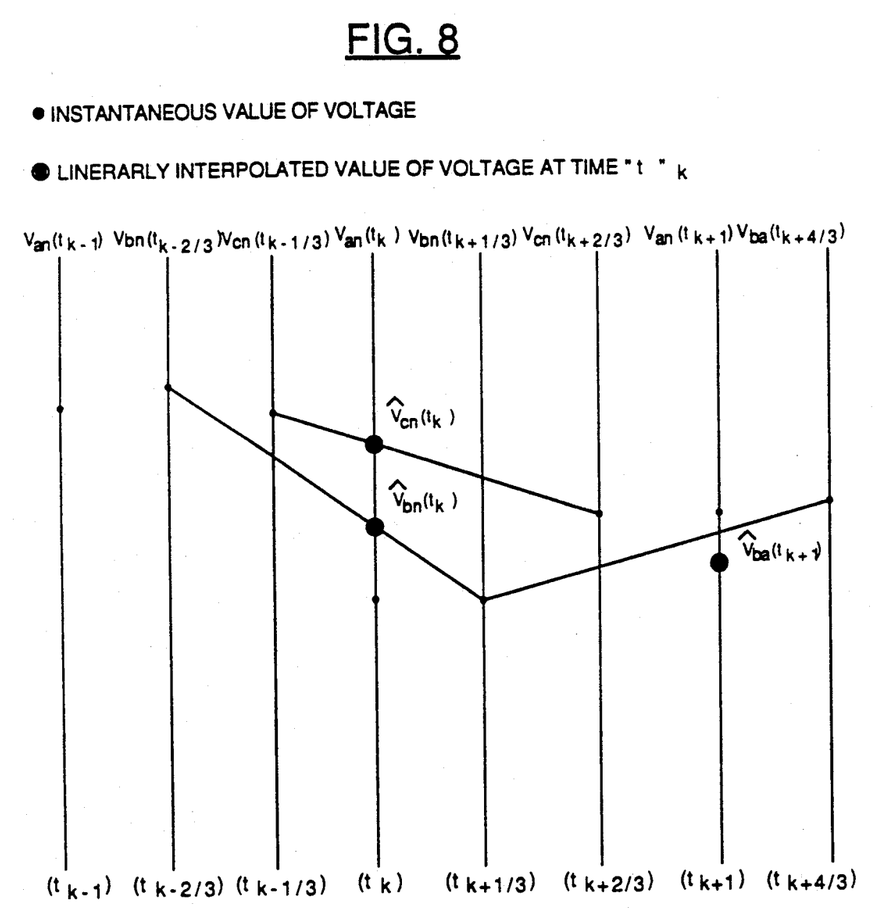
FIG. 8 another timing diagram, also according to the present invention, which illustrates a manner in which certain voltage samples may be used to estimate the magnitude of another voltage sample at the same point in time.

FIG. 8 is illustrative of this interpolation method. Each sampling time interval is identified between time lines $k-1$, $k$ and $k+1$. Thus, at each time line $k-1$, $k$ and $k+1$, the V1 signal is sampled (indicated as Va). The V2 and V3 signals (Vb and Vc) are sampled at the respective time lines immediately following time lines $k-1$, $k$ and $k+1$. Assuming that the sampling time interval may be divided into thirds to indicate the sampling times for each of the V2 and V3 signals, the corresponding time lines for these signals are indicated as $k-2/3$, $k+1/3$ and $k+4/3$ for V2 and as $k-1/3$ and $k+2/3$ for V3.

The line-line voltages $V_{ABrms}$, $V_{BCrms}$, and $V_{CArms}$ are estimated from $$v_{ab} = v_{an}(t_k) - v_{bn}(t_k)$$

$$v_{bc} = v_{bn}(t_k) - v_{cn}(t_k)$$

$$v_{ca} = v_{cn}(t_k) - v_{an}(t_k)$$

Where $v_{bn}(t_k)$, $v_{cn}(t_k)$ are obtained using the linear interpolation technique:

$$v_{bn}(t_k) = \frac{v_{bn}(t_{k-2})3 + 2v_{bn}(t_{k+1})3}{3}$$

$$v_{cn}(t_k) = \frac{2v_{cn}(t_{k-1})3 + v_{cn}(t_{k+2})3}{3}$$

Therefore $$V_{ABrms} = \sqrt{\frac{1}{N}\left(\sum_{k=0}^{N-1}[v_{an}(t_k) - v_{bn}(t_{k-2})3 + 2v_{bn}(t_{k+1})3]^2\right)}$$

-continued $$V_{BCrms} = \sqrt{\frac{1}{N}\left(\sum_{k=0}^{N-1}\left[\frac{v_{bn}(t_{k-2})3 + 2v_{bn}(t_{k+2})3}{3} - \frac{2v_{cn}(t_{k-1})3 + 2v_{cn}(t_{k-2})3}{3}\right]^2\right)}$$

$$V_{CArms} = \sqrt{\frac{1}{N}\left(\sum_{k=0}^{N-1}\left[\frac{2v_{cn}(t_{k-1})3 + v_{cn}(t_{k+2})3}{3} - v_{an}(t_k)\right]^2\right)}$$

Phase $V_{an}$ is used as reference.

Accordingly, these interpolated values are used to provide an apparently simultaneous sampling of the V1-V3 signals 256 times per signal cycle. This sampling approach provides an extremely accurate yet hardware-efficient and, therefore, inexpensive implementation.

Figure 9:
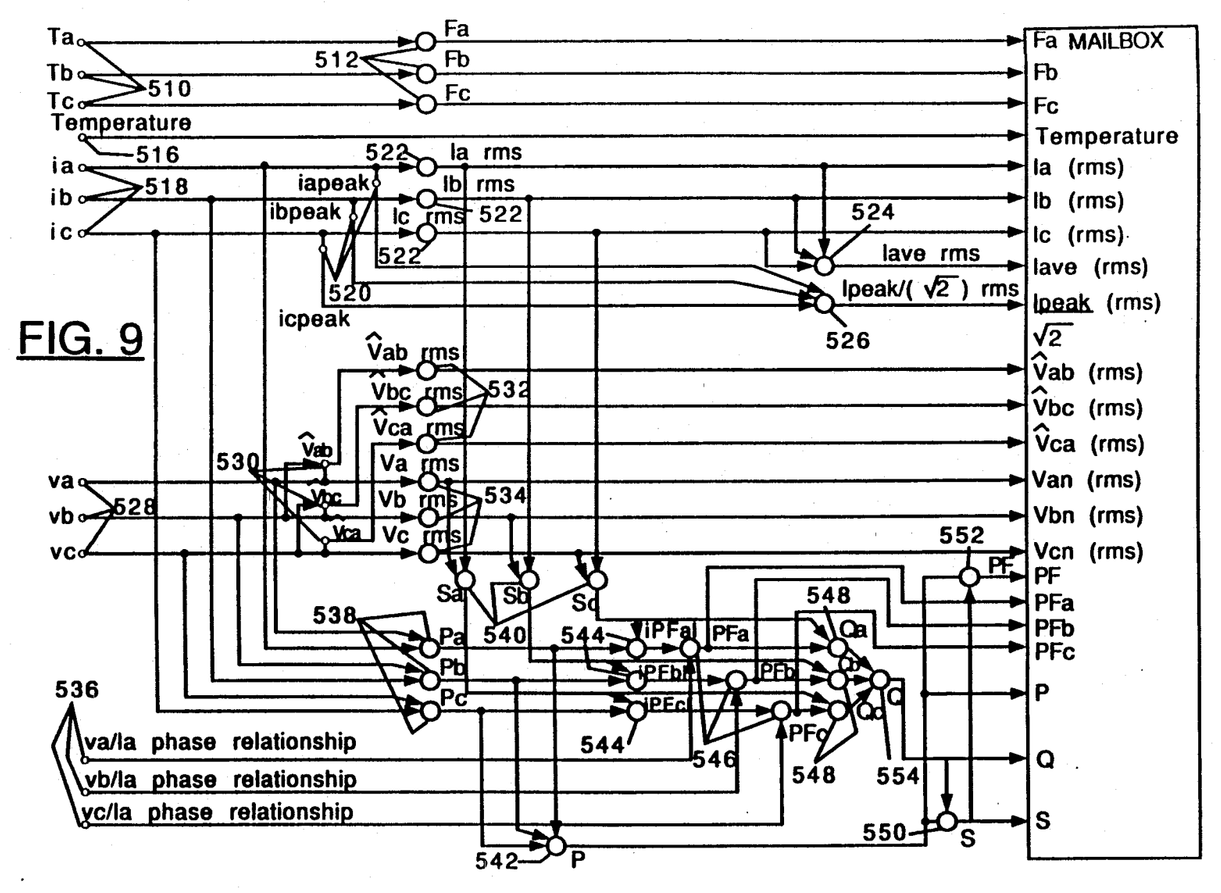
FIG. 9 is a nodal network chart illustrating certain computations which may be used for processing voltage and current samples retrieved from the three phase network of FIG. 1.

FIG. 9 depicts the processing and computation, in the form of a nodal network, for all the above computations and measurements which may be performed by the metering computer and passed to the communications computer via the mailbox. Points (or circles) are used to represent a specific computation or data retrieval. Arrows leading up to the points represent the information that is used to perform that computation. Information passed from the metering computer to the communications computer is depicted in the mailbox 132.

At points 510, the time between zero crossings for each phase is computed. From these times, the corresponding frequencies are computed, depicted at points 512, and passed to the mailbox 132. Retrieval of the temperature through the demultiplexer is shown at point 516.

The currents of the phases are sampled and processed at points 518-526. At points 520, the peak current levels for the entire cycle are continuously maintained so that the peak RMS current can be computed, at point 526, and sent to the mailbox. The RMS phase currents are processed at points 522 and passed to the mailbox. Using the RMS phase currents, the average RMS current is processed at point 524 and also reported via the mailbox.

The voltages of the phases are sampled and processed at points 528-534. At points 530 and 532, the voltages between the phases are estimated and their RMS values are computed using the previously discussed interpolation process. At points 534, the RMS voltages (with respect to the neutral line) of the phases are computed.

The remaining information sent to the mailbox is computed using the information obtained at the previously discussed points 518, 522, 528, 534 and at points 536 which depict the computation of the phase relationships between the voltage and current for each phase. These phase relationships may be obtained by comparing zero crossings of the voltage and current signals for each phase. At points 538 and 540, the real and apparent powers, respectively, for each phase are computed. Points 542 represent the computation of the average real power for all three phases. Points 544, 546 and 548 respectively represent the computations of the absolute value of the true power factors the signed power factors and the reactive power for each of the phases. At point 550, the three phase apparent power is computed, and at point 552, the true three phase power factor is determined. The total three phase power is computed at point 554.

The information that is transferred from the metering computer is retrieved by the communications computer for computation consisting of demand and energy readings which require some form of integration or averaging over time. These readings preferably include: the average demands of current in each of the three phases and of real power, the predicted demand of real power, the peak demand of current in each of the three phases and of real power, and the accumulated real and reactive energy.

Figure 10:
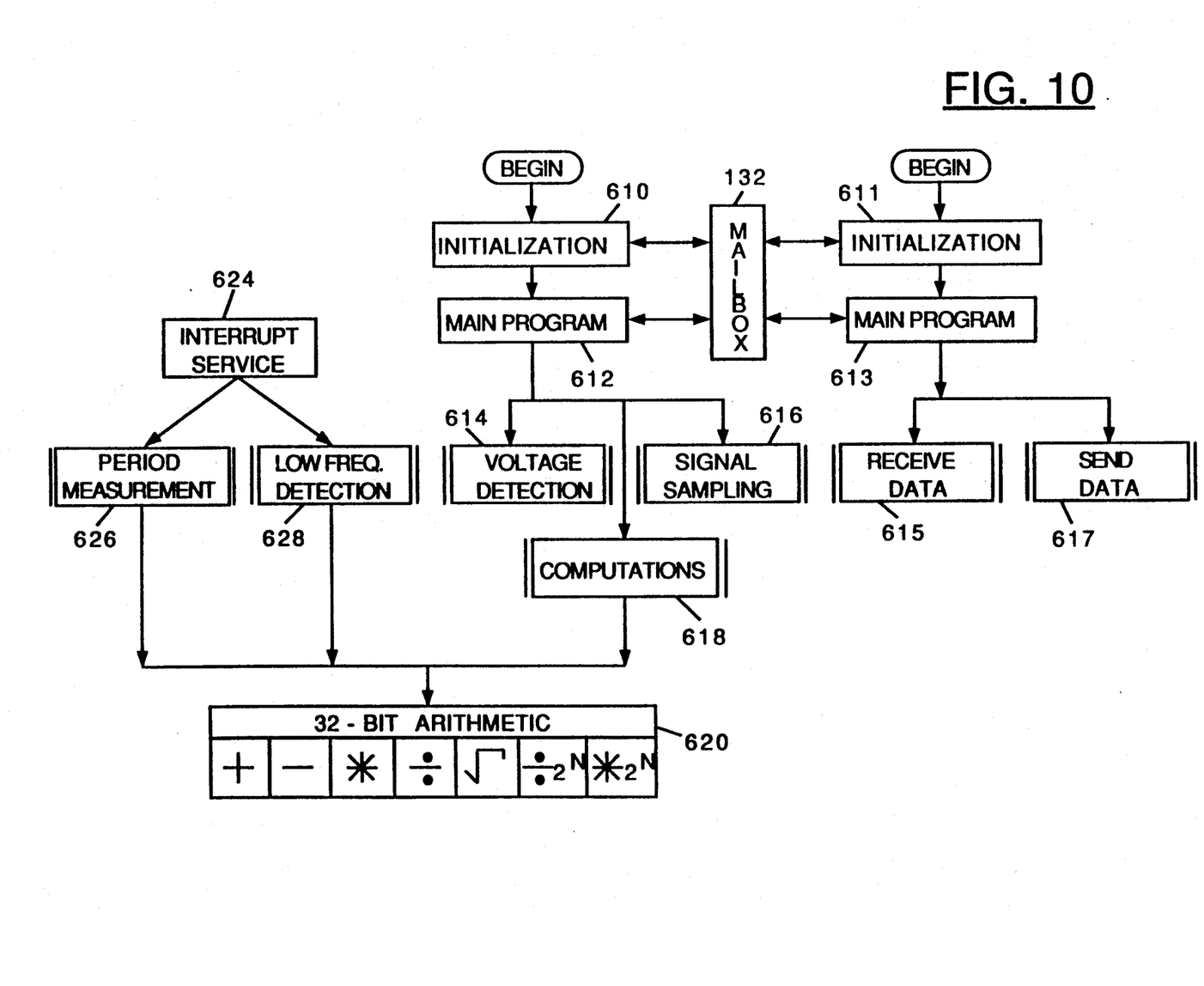
FIG. 10 comprises a pair of structure charts illustrating a preferred structure for programming metering and communications computers of FIG. 3.

In FIG. 10, a pair of structure charts is shown which may be used as a basis from which to program for the metering computer 116 and communications computer 128. The mailbox 132 is shown to represent times at which data may be passed between the computers 116 and 128. The charts begin at blocks 611 where the computers initialize themselves as discussed in connection with FIG. 7. The mailbox is used at this point for establishing the parameters, e.g., current ratings, which are specific to the metering unit.

From blocks 610 and 611, flow proceeds to blocks 612 and 613, respectively, where the main programs for each computer are represented. In these main programs 612 and 613, general operating system instructions are executed and the computed power-related information is passed from the metering computer to the communications computer. Commands to the metering unit are received using a data reception subroutine 615, while information reported to the control station (FIG. 1) is implemented using a data transmission subroutine 617. The general operating system instructions in the main programs include instructions which call various subroutines, such as those subservient blocks depicted below the main programs 612 and 613.

Subroutines which are called by the main program 612 include a voltage detection subroutine 614 and a signal sampling subroutine 616. The signal sampling subroutine 616 is called to sample each of the six inputs to the demultiplexer as previously discussed in connection with FIG. 5. That is, for the next cycle/256 time period: the V1 and I1 signals are sampled, converted and read; then the V2 and I2 signals are sampled, converted and read; and finally the V3 and I3 signals are sampled, converted and read.

The voltage detection subroutine 614 is used to determine if the metering unit is energized, i.e., if the unit is measuring realistic power-related information from the three phase network. Energization is present when a significant voltage level is detected on several consecutive samples for each phase. For example, if $20 \times 1.414$ volts is detected on each phase four consecutive times, the system is considered energized. Such energization is a prerequisite for any substantive information being reported from the metering unit.

The main program 612 also calls a computation subroutine 618 which performs the computations discussed in connection with FIG. 9. Specific calculations performed by the computation subroutine 618 are implemented in the form of arithmetic subroutines 620. For the sake of accuracy, the arithmetic subroutines 620 are preferably implemented using 32-bit floating point arithmetic.

Interruptions (firmware interrupts), depicted by block 624, to the program operation of the metering computer may occur at virtually any time. Such interrupts may be handled by interrupt service routines, as depicted by period measurement and low frequency detection routines 626 and 628. The period measurement routine 626 is called to determine the period and, thus, the frequency of each of the phases, as discussed in connection with FIG. 9. The low frequency detection routine 628 is used to detect whether or not the measured frequencies of the phases A, B and C are below 24 Hz, as previously discussed in connection with the frequency information sent through the mailbox. The routines 626 and 628 may also call the arithmetic subroutines 620 to perform any necessary calculations.

While the invention has been particularly shown and described with reference to a particular embodiment, it will be recognized by those skilled in the art that modifications and changes may be made to the present invention described above without departing from the spirit and scope thereof.

APPENDIX A

PHASE VOLTAGE RMS CALCULATIONS $$V_{Arms} = \sqrt{\frac{1}{N}\left(\sum_{k=0}^{n-1}[V_{an}(t_k)]^2\right)}$$

$$V_{Brms} = \sqrt{\frac{1}{N}\left(\sum_{k=0}^{n-1}[V_{bn}(t_k)]^2\right)}$$

$$V_{Crms} = \sqrt{\frac{1}{N}\left(\sum_{k=0}^{n-1}[V_{cn}(t_k)]^2\right)}$$

Where $v_{an}(t_k)$, $v_{bn}(t_k)$, $v_{cn}(t_k)$ are sample values at sample time $t_k$

LINE CURRENT RMS CALCULATION $$I_{Arms} = \sqrt{\frac{1}{N}\left(\sum_{k=0}^{n-1}[i_a(t_k)]^2\right)}$$

$$I_{Brms} = \sqrt{\frac{1}{N}\left(\sum_{k=0}^{n-1}[i_b(t_k)]^2\right)}$$

$$I_{Crms} = \sqrt{\frac{1}{N}\left(\sum_{k=0}^{n-1}[i_c(t_k)]^2\right)}$$

AVERAGE 3-PHASE CURRENT RMS CALCULATION $$I_{AVERrms} = \frac{I_{Arms} + I_{Brms} + I_{Crms}}{3}$$

APPARENT RMS CURRENT CALCULATION

-continued
APPENDIX A $$\text{Apparent } I_{rms(A)} = \frac{|i_{a\,peak}|}{\sqrt{2}} \quad (13)$$

$$\text{Apparent } I_{rms(B)} = \frac{|i_{b\,peak}|}{\sqrt{2}} \quad (14)$$

$$\text{Apparent } I_{rms(C)} = \frac{|i_{c\,peak}|}{\sqrt{2}} \quad (15)$$

The maximum value of (13) to (15) is reported.

TOTAL 3-PHASE REAL POWER CALCULATIONS $$P_A = \frac{1}{N}\sum_{k=0}^{n-1}[V_{an}(t_k)][i_a(t_k)]$$

$$P_B = \frac{1}{N}\sum_{k=0}^{n-1}[V_{bn}(t_k)][i_b(t_k)]$$

$$P_{3PH\text{-}TOTAL} = P_A + P_B + P_C \quad (16)$$

TOTAL 3-PHASE REACTIVE POWER CALCULATIONS $$\text{Power Factor } A, PF_A = \frac{P_A}{V_{ANrms}I_{Arms}}$$

$$Q_A = V_{ANrms}I_{Arms}\sqrt{1-(PF_A)^2}$$

$$\text{Power Factor } B, PF_B = \frac{P_B}{V_{BNrms}I_{Brms}}$$

$$Q_B = V_{BNrms}I_{Brms}\sqrt{1-(PF_B)^2}$$

$$\text{Power Factor } C, PF_C = \frac{P_C}{V_{CNrms}I_{Crms}}$$

$$Q_C = V_{CNrms}I_{Crms}\sqrt{1-(PF_C)^2}$$

$$Q_{3PH\text{-}TOTAL} = Q_A + Q_B + Q_C \quad (17)$$

TOTAL 3-PHASE APPARENT POWER CALCULATION $$S_{3PH\text{-}TOTAL} = P_{3PH\text{-}TOTAL}\sqrt{1 + \left(\frac{Q_{3PH\text{-}TOTAL}}{P_{3PH\text{-}TOTAL}}\right)^2} \quad (18)$$

Where $P_{3PH\text{-}TOTAL}$ is from equation (16), and $Q_{3PH\text{-}TOTAL}$ is from equation (17).

PER PHASE POWER FACTOR CALCULATION $$PF_A = \frac{P_A}{V_{ANrms}I_{Arms}}$$

$$PF_B = \frac{P_B}{V_{BNrms}I_{Brms}}$$

$$PF_C = \frac{P_C}{V_{CNrms}I_{CXrms}}$$

TOTAL 3-PHASE POWER FACTOR CALCULATION $$PF_{3PH\text{-}TOTAL} = \frac{P_{3PH\text{-}TOTAL}}{S_{3PH\text{-}TOTAL}}$$

Where $P_{3PH\text{-}TOTAL}$ is from equation (16) and $S_{3PH\text{-}TOTAL}$ is from equation (18).

What is claimed is:

1. A circuit monitoring arrangement for monitoring power lines in a distributed power network, carrying power-related waveform, the arrangement comprising:
   a plurality of circuit monitors which are adjacent at various points along the power line, each said circuit monitor having:
   a sensor, disposed adjacent the power line, for sensing power-related parameters associated with the power-related waveform;
   sampling means, responsive to a control signal generated from a control center, for sampling the power-related waveform at a time prescribed by the control signal; and
   generation means, responsive to said sampling means, for generating data representative of said sampled points; and
   said control center being remotely coupled to receive said representative data from said plurality of circuit monitors and to send the control signal to said plurality of circuit monitors so that each of said plurality of circuit monitors samples the power-related waveform approximately simultaneously.

2. A circuit monitoring arrangement, according to claim 1, further including detection means for sensing zero-crossings of the power-related waveform.

3. A circuit monitoring arrangement, according to claim 2, further including means, responsive to said detection means, for determining the time between successive ones of said zero-crossings.

4. A circuit monitoring arrangement, according to claim 3, wherein said detection means and said generation means are implemented using a microcomputer.

5. A circuit monitoring arrangement, according to claim 1, wherein the control signal is used to command each of said plurality of circuit monitors to sample the power-related waveform at a prescribed future point in time.

6. A circuit monitoring arrangement, according to claim 1, wherein said sampling means is implemented using a microcomputer.

7. A circuit monitoring arrangement, according to claim 6, wherein the control signal is used to preprogram said plurality of circuit monitors to sample the power-related waveform at a prescribed future point in time.

8. A circuit monitoring system for a distributed power network, wherein power-related waveforms are passed through a multitude of associated network branches and wherein zero-crossings of the waveforms define their respective cycles, the system comprising:
   a plurality of monitoring means, each of which is disposed adjacent an associated one of the branches, for sensing power-related parameter associated with the power-related waveforms and for generating and transmitting data representative thereof, each of said monitoring means including detection means for sensing the zero-crossing of the waveform and sampling means for sampling the power-related waveform over a plurality of integral cycles for a predetermined number of sample points; and
   a control station, remotely communicatively coupled to each of the monitoring means, for receiving and evaluating the data transmitted therefrom and for generating sampling commands to command each of said plurality of monitoring means to sample the power-related waveform at a prescribed future point in time wherein said control station remotely instructs each of said plurality of monitoring means to sense the power-related parameters simultaneously.

9. A circuit monitoring system, according to claim 8 wherein said sampling means includes means for commencing said sampling based on one of the sensed zero-crossings.

10. A circuit monitoring system, according to claim 8, further including a microcomputer, coupled to said sampling means, which is programmed to receive at least one of said sampling commands and to instruct said sampling at said prescribed point in time.

11. For use in a monitoring arrangement which is controlled by a user-operated control station and which monitor power lines carrying a power-related waveform in a distributed power network, a circuit monitor comprising:
   a sensor circuit, disposed adjacent the power line, for sensing a plurality of power-related parameters associated with the power-related waveform;
   a sampling circuit including:
   a first microcomputer,
   a multiplexer, responsive to the first microcomputer and to the sensor circuit, for sampling the power-related parameters and providing a plurality of output signals therefrom, and
   an analog to digital converter circuit which converts the multiplexer output signals,
   wherein the first microcomputer receives the converted power-related waveform samples to detect zero crossings therein and to perform power-related computations; and
   a second microcomputer, receptive of the power-related computations, which communicates with the user-operated control station.

12. A circuit monitor, according to claim 11, wherein the first microcomputer controls the multiplexer to capture a predetermined number of samples on a continuous basis.

13. A circuit monitor, according to claim 12, wherein the predetermined number of samples is 256.

14. A circuit monitor, according to claim 11, wherein the zero crossings define cycles in the power-related waveform and wherein the power-related waveform is automatically sampled over a plurality of integral cycles for a predetermined number of sample points.

15. A circuit monitor, according to claim 11, further including a two-way data latch arranged to couple data between the first and second microcomputers.

16. A circuit monitoring arrangement for monitoring power lines in a distributed power network, wherein the power lines carry a power-selected waveform, the arrangement comprising:
   a plurality of circuit monitors which are situated adjacent at various points along the power line, each said circuit monitor having:
   a sensor, disposed adjacent the power line, for sensing power-related parameters associated with the power-related waveform:
   a sampling circuit, responsive to a control signal generated from a control center, for sampling the power-related waveform at a time prescribed by the control signal, said sampling circuit including:
   a first microcomputer, a multiplexer, responsive to the first microcomputer and to the sensor circuit, for sampling the power-related waveform, and an analog to digital converter circuit which converts the power-related waveform samples from the multiplexer, wherein the first microcomputer receives the converted power-related waveforms samples to detect zero crossings therein and to perform power-related computations; and a second microcomputer, receptive of the power-related computations, which communicates with the user-operated control station;

said control center being remotely coupled to receive data representative of the power-related waveform samples from said plurality of circuit monitors and to send the control signal to said plurality of circuit monitors so that each of said plurality of circuit monitors samples the power-related waveform approximately simultaneously.

17. A circuit monitoring arrangement, according to claim 16 wherein the first microcomputer controls the multiplexer to capture a predetermined number of samples on a continuous basis.

18. A circuit monitoring arrangement, according to claim 16, wherein the predetermined number of samples if 256 and wherein the timing-related signal is used to preprogram said plurality of circuit monitors to sample the power-related waveform at a prescribed future point in time.

19. A circuit monitoring arrangement, according to claim 16, wherein the zero crossings define cycles in the power-related waveform and wherein the power-related waveform is automatically sampled over a plurality of integral cycles for 256 sample points.

20. A circuit monitoring arrangement, according to claim 19, wherein the control signal is used to preprogram said plurality of circuit monitors to sample the power-related waveform at a prescribed future point in time.

21. For use in a circuit monitoring arrangement which is controlled by a user-operated control station and which monitors power distributed to a plurality of powered equipment, wherein a power-related waveform passes from a non-residential loadcenter to each of the powered equipment through a power line, a circuit monitor comprising:

a sensor circuit, disposed adjacent the power line and between the non-residential loadcenter and at least one of the powered equipment, for sensing a plurality of power-related parameters associated with the power-related waveform;

sampling means, responsive to a control signal generated from the control station, for sampling the power-related waveform at a time prescribed by the control signal;

generation means, responsive to said sampling means, for generating data representative of the power-related waveform; and receiving means, coupled to said sampling means, for receiving the control signal from the control station for instructing said circuit monitor to sample the power-related waveform at a prescribed future point in time wherefrom said generation means determines power-related information of the power line between the non-residential loadcenter and the powered equipment.

22. A circuit monitor, according to claim 21, wherein zero-crossings of the waveform define cycles of the power-related waveform and wherein the power-related waveform is automatically sampled over a plurality of integral cycles for a predetermined number of sample points.

23. A circuit monitor, according to claim 21, wherein said sampling means comprises:

a first microcomputer;

a multiplexer, responsive to the first microcomputer and to the sensor circuit, for sampling the power-related waveform;

an analog to digital converter circuit which converts the power-related waveform samples from the multiplexer; and wherein the first microcomputer receives the converted power-related waveforms samples to detect zero crossings therein and to perform power-related computations.

24. A circuit monitor, according to claim 23, wherein said generation means and said receiving means are implemented using a second microcomputer.

* * * * *